(12) United States Patent
Chang et al.

(10) Patent No.: US 8,686,395 B2
(45) Date of Patent: Apr. 1, 2014

(54) BOND TYPE FLIP-CHIP LIGHT-EMITTING STRUCTURE AND METHOD OF MANUFACTURING THE SAME

(71) Applicant: Chang Gung University, Tao-Yuan (TW)

(72) Inventors: Liann-Be Chang, Tao-Yuan (TW); Chen Xu, Beijing (CN); Kun Xu, Beijing (CN); Yunyun Zhang, Tianjin (CN); How-Wen Chien, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 0 days.

(21) Appl. No.: 13/775,539

(22) Filed: Feb. 25, 2013

(65) Prior Publication Data

US 2013/0234105 A1    Sep. 12, 2013

(30) Foreign Application Priority Data

Mar. 12, 2012  (TW) .............................. 101108373 A (51) Int. Cl.
*H01L 29/06* (2006.01)
(52) U.S. Cl.
USPC ....................... 257/9; 257/321; 257/E33.008

(58) Field of Classification Search
USPC .......... 257/9, 321, E33.008, E31.033; 438/22
See application file for complete search history.

(56) References Cited

U.S. PATENT DOCUMENTS

| | | | |
|---|---|---|---|
| 7,601,979 B2* | 10/2009 | Miki et al. | 257/9 |
| 2012/0056150 A1* | 3/2012 | Lee et al. | 257/9 |
| 2013/0153951 A1* | 6/2013 | Nihei et al. | 257/99 |

* cited by examiner

*Primary Examiner* — Chuong A Luu
*Assistant Examiner* — Nga Doan
(74) *Attorney, Agent, or Firm* — Muncy, Geissler, Olds & Lowe, P.C.

(57) ABSTRACT

A bond type flip-chip light-emitting structure and method of manufacturing the same. Firstly, form a positive electrode and a negative electrode on an epitaxy layer. Next, deposit an insulation layer on parts of the positive electrode and negative electrode, to expose respectively a positive electrode via hole and a negative electrode via hole. Then, form a bonded metal layer on the insulation layer, the positive electrode via hole, and the negative electrode via hole, so that the positive electrode and the negative electrode are on a same plane by means of the bonded metal layer. Finally, on a substrate, bond the first metal layer and the second metal layer onto the corresponding first bonded metal unit and the second bonded metal unit of the bonded metal layer, to form into shape, thus realizing a bond type flip-chip light-emitting structure.

9 Claims, 8 Drawing Sheets

BOND TYPE FLIP-CHIP LIGHT-EMITTING STRUCTURE AND METHOD OF MANUFACTURING THE SAME

BACKGROUND OF THE INVENTION

1. Field of the Invention

The present invention relates to a bond type flip-chip light-emitting structure and method of manufacturing the same, and in particular to a bond type flip-chip light-emitting structure, that is realized through a light-emitting-diode (LED) made by bonding a metal layer and a substrate into shape, to increase its contact area effectively, hereby increasing its heat dissipation capability.

2. The Prior Arts

In recent years, the light-emitting-diode (LED) has been considered one of the most promising Industries, mainly for its advantages of compact size, high efficiency, fast response, long service life, and not containing mercury hazardous to the environment, thus it is suitable for high power illumination.

However, the most important disadvantages of LED is its heat dissipation problem. To be more specific, when its light radiation efficiency is not good enough, such that the light that can not pass through and leave the light-emitting structure (the LED and its package) is turned into heat. In operation, in case the heat thus generated can not be led out of the light-emitting structure, then the temperature of the LED will certainly increase, to cause decrease of its reliability and performance.

Figure 1:
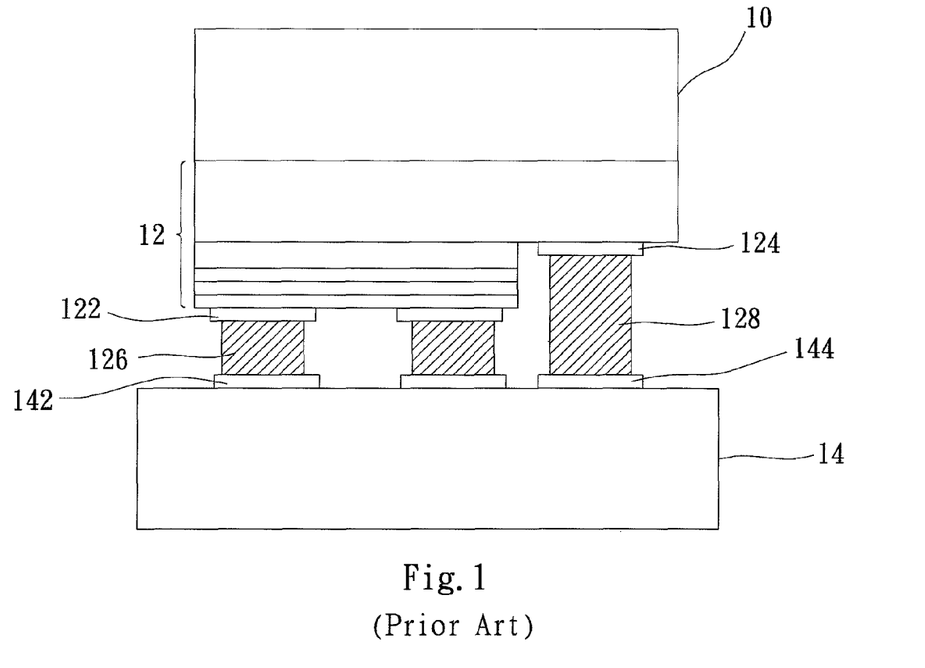
FIG. 1 is a schematic diagram of flip-chip light-emitting structure of the prior art.

For this reason, various heat dissipation solutions have been proposed for the light-emitting structure. Refer to FIG. 1 for a schematic diagram of the a flip-chip light-emitting structure of the prior art. As shown in FIG. 1, firstly, a GaN series LED 12 is grown on a sapphire substrate 10. Then a secondary transfer approach is used to remove the sapphire substrate 10 of inferior heat conductivity by means of laser irradiation or chemical etching. Subsequently, a silicon substrate 14 of better heat conductivity is bonded thereon to improve the heat dissipation capability of the LED. In the process mentioned above, flip-chip bonding is used to replace the conventional wire-bonding. The LED 12 thus produced includes: a first electrode 122, a second electrode 124, and a first weld-connection layer 126 and a second weld-connection layer 128 formed respectively on the first electrode 122 and the second electrode 124.

In the bonding process, the first weld-connection layer 126 and the second weld-connection layer 128 are bonded onto the corresponding first connection pad 142 and the second connection pad 144 on the silicon substrate 14 respectively.

In the structure mentioned above, in general, the weld-connection layer and connection pad are made of tin balls. As such, tin balls are fused to bond the LED 12 onto the silicon substrate 14. However, in this bonding and pressing process, the fused tin paste tends to exude out, and it can evenly overflow to the sidewall of LED 12, to cause short circuit of the p-n semiconductor layer in the LED 12, thus resulting in failure of the light-emitting structure. Moreover, in the flip chip process using the tin balls, the contact area between the LED chip and the substrate is rather small, so that heat can not be dissipated effectively. In addition, in this structure, area of negative electrode can not be reduced, so that the light emitting area is limited, hereby affecting its light-emitting efficiency. So, how to raise light emitting efficiency and heat dissipation efficiency is a problem that has to be solved urgently.

Therefore, presently, the design and performance of light-emitting structure of the prior art is not quite satisfactory, and it has much room for improvements.

SUMMARY OF THE INVENTION

In the flip-chip light-emitting structure of the prior art, a plurality of tin balls are used to connect LED to the substrate, that has the problem of poor heat dissipation and overly large negative electrode area. Also, it has the shortcomings of complicated manufacturing process, requiring large machine to produce, and overly high packaging cost. To overcome these deficiencies, the present invention provides a bond type flip-chip light-emitting structure and method of manufacturing the same, to overcome the above-mentioned problems of the prior art.

A major objective of the present invention is to provide a bond type flip-chip light-emitting structure and method of manufacturing the same. Wherein, bonded metal layers replace the bonded tin balls, to reduce its production cost, while increasing its heat dissipation area, and raising its light emitting efficiency.

Another objective of the present invention is to provide a bond type flip-chip light-emitting structure and method of manufacturing the same, such that it can use an eutectic packaging process, to reduce the production cost effectively.

In order to achieve the above-mentioned objective, the present invention provides a bond type flip-chip light-emitting structure and method of manufacturing the same, including the following steps: form sequentially an n-type semiconductor layer, a multi-quantum-well light-emitting layer, and a p-type semiconductor layer on a carrier board, to produce an epitaxy layer. Next, grow a positive electrode on the p-type semiconductor layer, to form a negative electrode on the n-type semiconductor layer, that are located on the side wall of the multi-quantum-well light-emitting layer. Then, deposit an insulation layer on parts of the positive electrode and negative electrode, to expose a positive electrode via hole and a negative electrode via hole, such that the positive electrode via hole and the negative electrode via hole are on the opposite sides of the insulation layer. Then, form a bonded metal layer on the insulation layer, positive electrode via hole, and the negative electrode via hole. Then, remove a part of the bonded metal layer, to expose a part of the insulation layer, so that the bonded metal layer is divided into a first bonded metal unit and a second bonded metal unit insulated to each other, and that are connected respectively to the positive electrode and the negative electrode, to make the positive electrode and negative electrode substantially on a same plane. Subsequently, provide a substrate, such that the first metal layer and the second metal layer on the substrate correspond respectively to the first bonded metal unit and the second bonded metal unit, then perform bonding them into shape. And finally, remove the carrier board, to realize and complete the bond type flip-chip light-emitting structure.

In addition, the present invention provides a bond type flip-chip light-emitting structure, including a light-emitting-diode (LED) and a substrate. The LED includes an epitaxy layer, a positive electrode, a negative electrode, an insulation layer, and a bonded metal layer. Wherein, the epitaxy layer contains sequentially an n-type semiconductor layer, a multi-quantum-well light-emitting layer, and a p-type semiconductor layer. The positive electrode is on the p-type semiconductor layer, and the negative electrode is on the n-type semiconductor layer, that are located on a side wall of the multi-quantum-well light-emitting layer. The insulation layer is disposed on parts of the positive electrode and negative electrode, to expose respectively a positive electrode via hole and a negative electrode via hole. Then, a bonded metal layer is disposed on the insulation layer, and parts of the positive electrode and the negative electrode. Wherein, the bonded metal layer is composed of the first bonded metal unit and the second bonded metal unit insulated to each other, and are connected respectively to the positive electrode and the negative electrode. The substrate is provided with a first metal layer and a second metal layer having electrode patterns, that are connected to the corresponding electrode patterns on the first bonded metal unit and the second bonded metal unit, to connect the LED and the substrate.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings. And, in the following, various embodiments are described in explaining the technical characteristics of the present invention.

Figure 2:
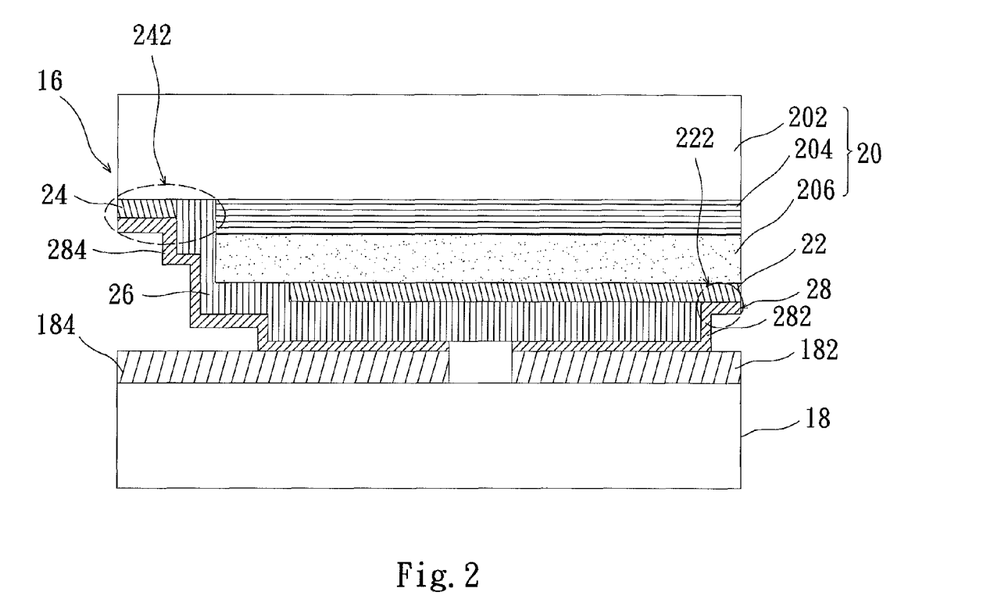
FIG. 2 is a schematic diagram of a bond type flip-chip light-emitting structure according to the present invention.

Firstly, refer to FIG. 2 for a schematic diagram of a bond type flip-chip light-emitting structure according to the present invention. As shown in FIG. 2, the bond type flip-chip light-emitting structure of the present invention includes, a light-emitting-diode (LED) 16 and a substrate 18. The LED 16 includes an epitaxy layer 20, a positive electrode 22, a negative electrode 24, an insulation layer 26, and a bonded metal layer 28. Wherein, the epitaxy layer 20 contains sequentially an n-type semiconductor layer 202, a multi-quantum-well light-emitting layer 204, and a p-type semiconductor layer 206. When driven by a voltage, the epitaxy layer 20 will emit light. The positive electrode 22 is on the p-type semiconductor layer 206, and the negative electrode 24 is on the n-type semiconductor layer 202, that are located on side wall of the multi-quantum-well light-emitting layer 204. The insulation layer 26 is disposed on parts of the positive electrode 22 and negative electrode 24, to expose respectively a positive electrode via hole 222 and a negative electrode via hole 242. The bonded metal layer 28 is composed of a first bonded metal unit 282 and a second bonded metal unit 284 insulated to each other, and that are connected respectively to the positive electrode 22 and the negative electrode 24. The substrate 18 is provided with a first metal layer 182 and a second metal layer 184 having electrode patterns, and that are connected to the corresponding electrode patterns on the first bonded metal unit 282 and the second bonded metal unit 284, to connect the LED 16 to the substrate 18.

Figure 3:
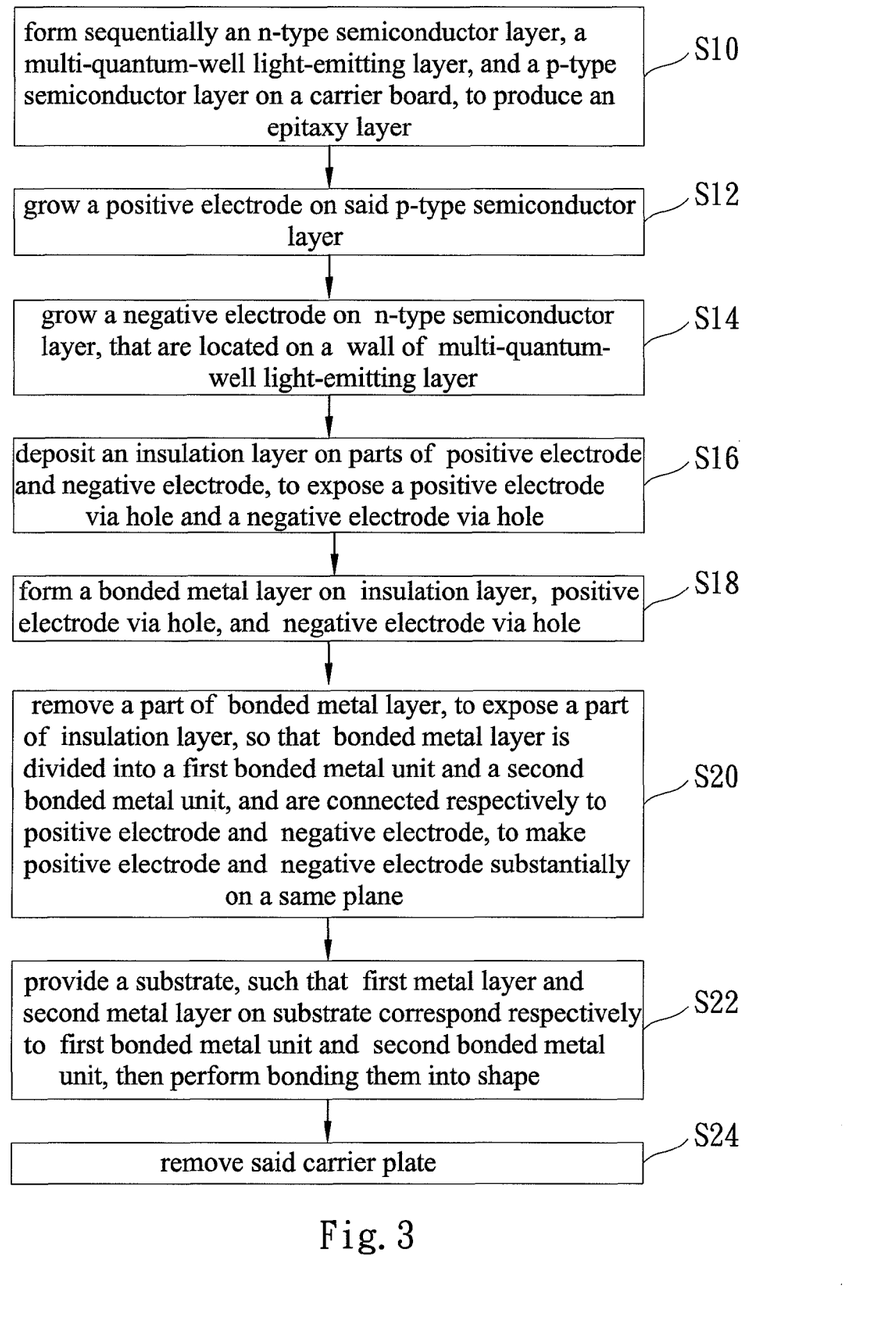
FIG. 3 is a flowchart of the steps of a bond type flip-chip light-emitting structure manufacturing method according to the present invention.

To understand further how the method of the present invention is used to simplify the manufacturing process, to produce light-emitting structure of high light emitting efficiency and high heat dissipation capability, refer to FIGS. 2, 3, and 4A to 4H. FIG. 3 is a flowchart of the steps of a bond type flip-chip light-emitting structure manufacturing method according to the present invention; and FIGS. 4A to 4H are schematic diagrams of various stages of assembling a bond type flip-chip light-emitting structure corresponding to the steps of its manufacturing.

Figure 4A:
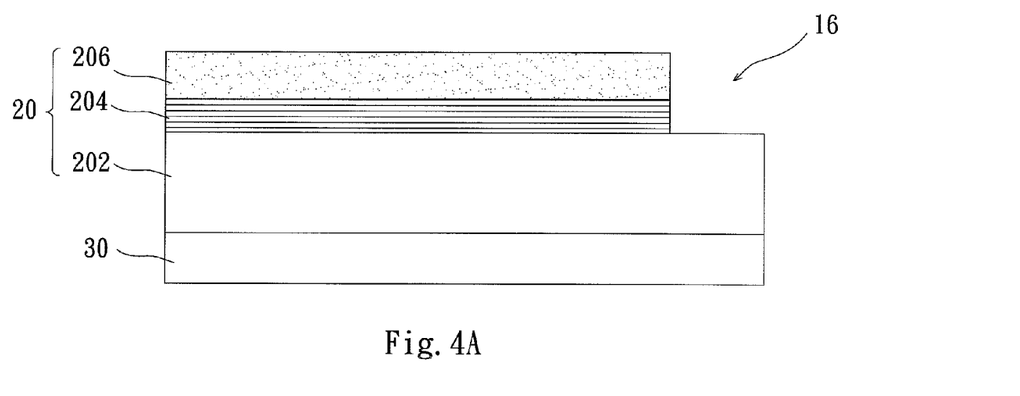
FIGS. 4A to 4H are schematic diagrams of various stages of assembling a bond type flip-chip light-emitting structure corresponding to the steps of its manufacturing.
Figure 4B:
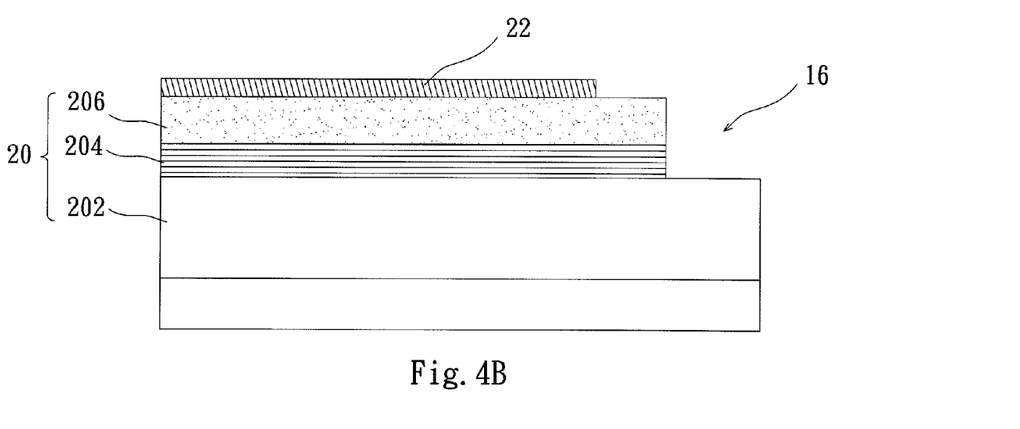
Figure 4C:
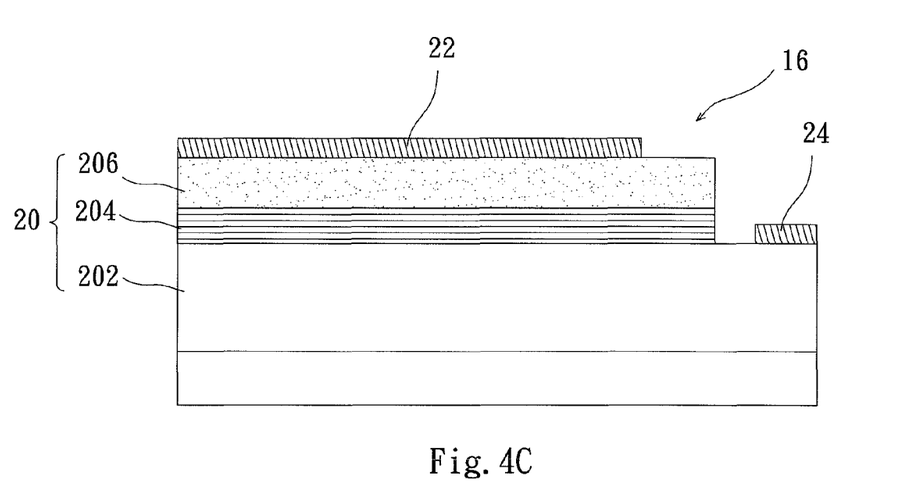

As shown in step S10 of FIG. 3, in order to produce a structure of light-emitting-diode 16, firstly, form sequentially an n-type semiconductor layer 202, a multi-quantum-well light-emitting layer 204, and a p-type semiconductor layer 206 on a carrier board 30, such as a sapphire substrate, to produce an epitaxy layer 20, as shown in FIG. 4A. Next, grow a positive electrode 22 on the p-type semiconductor layer 206, the positive electrode 22 can be made of Mo/Ag/Au, Ti/Al/Ti/Au, Pt/Ag/Au, Cr/Pt/Au, or Ni/Al/Ti/Au, as shown in FIG. 4B. Then, as shown in step S14, grow a negative electrode 24 on the n-type semiconductor layer 202, that are located on side wall of the multi-quantum-well light-emitting layer 204. Wherein, the negative electrode 24 can be made of Mo/Ag/Au, Ti/Al/Ti/Au, Pt/Ag/Au, Cr/Pt/Au, or Ni/Al/Ti/Au. At this time, the positive electrode 22 and the negative electrode 24 are not on the same plane, and a distance is formed between the negative electrode 24 and the multi-quantum-well light-emitting layer 204, as shown in FIG. 4C.

Figure 4D:
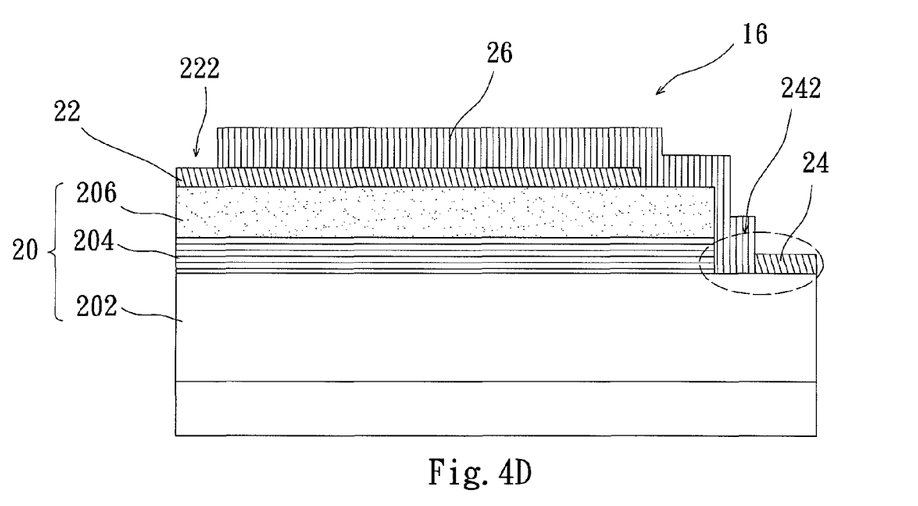

Subsequently, as shown in step S16, deposit an insulation layer 26 on parts of the positive electrode 22 and negative electrode 24, so that the regions not being deposited and covered expose a positive electrode via hole 222 and a negative electrode via hole 242. Wherein, the negative electrode via hole 242 is the region between the negative electrode 242 and the multi-quantum-well light-emitting layer 204. At this time, the positive electrode via hole 222 and the negative electrode via hole 242 are on the opposite sides of the insulation layer 26, and the insulation layer 26 can be made of silicon dioxide, silicon nitride, aluminum oxide, or aluminum nitride. Of course, insulation layer 26 can also be made of zinc oxide, and that is realized through sputtering zinc oxide on parts of positive electrode 22 and negative electrode 24 under 400° C., so that the insulation layer 26 can have anti-electrostatic capability, as shown in FIG. 4D. Wherein, the insulation layer 26 is deposited on positive electrode 22 and negative electrode 24 at their corresponding positions, to form a step-shaped insulation layer. By way of example, the insulation layer 26 is deposited and covered on the positive electrode 22 in a planar way, to form a trapezoid-shape having height difference, according to the height difference of the positive electrode 22, the p-type semiconductor layer 206, the multi-quantum-well light-emitting layer 204, and the height difference and distance spaced of negative electrode 24, the p-type semiconductor layer 206, the multi-quantum-well light-emitting layer 204. As such, the pattern of the insulation layer 26 thus deposited is a step-shaped insulation layer.

Then, as shown in step S18, form a bonded metal layer 28, to cover entirely the insulation layer 26, the positive electrode via hole 222, and the negative electrode via hole 242.

Figure 4E:
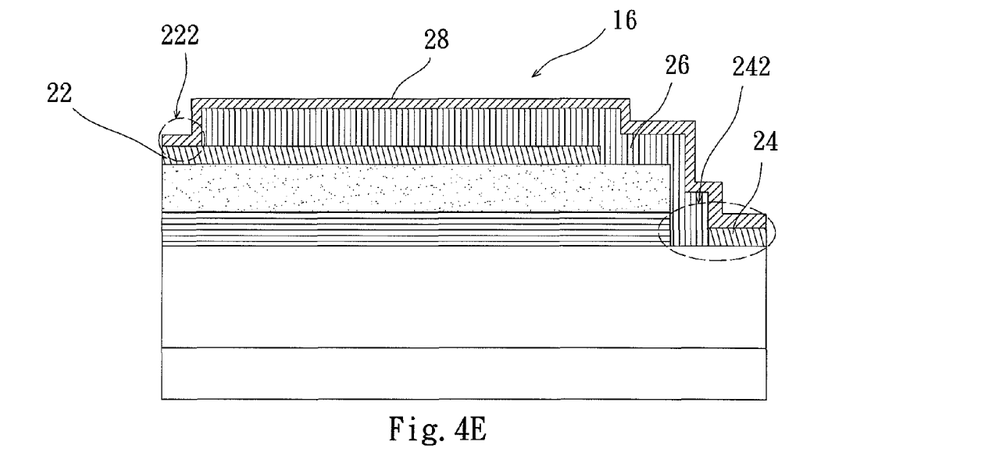

Wherein, bonded metal layer 28 can be made of Ti/Au, Sn/Au, Cu/Sn, Ti/Cu/Sn, or Ti/Au/Sn, as shown in FIG. 4E.

Moreover, as shown in step S20, remove a part of bonded metal layer 28, to form an insulation opening 286, to expose a part of insulation layer 26. Herein, the size of the insulation opening 286 can be varied depending on the actual requirements. As such, the bonded metal layer 28 can be divided into a first bonded metal unit 282 and a second bonded metal unit 284, and are connected respectively to the positive electrode 22 and the negative electrode 24, to make the positive electrode 22 and negative electrode 24 substantially on a same plane.

Figure 4F:
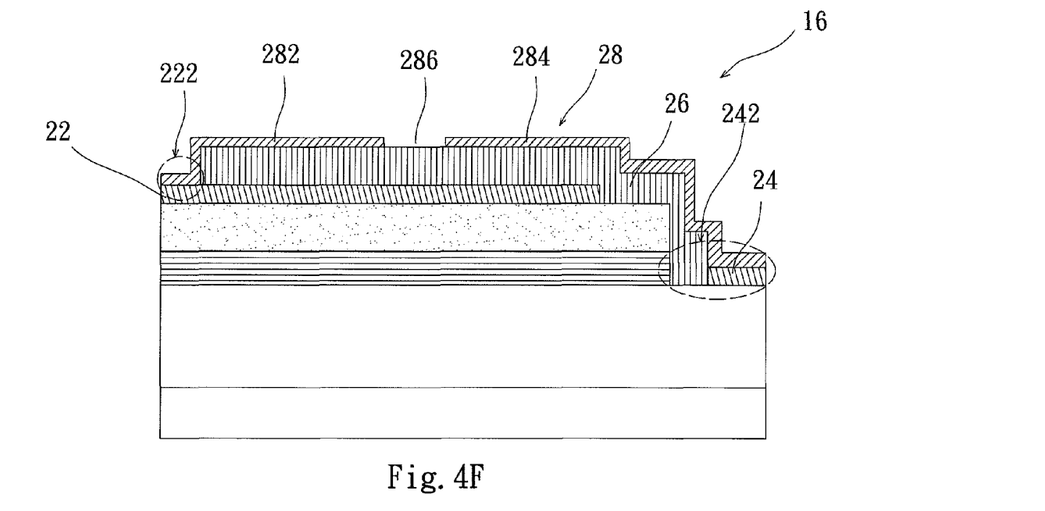

By way of an example, since the positive electrode via hole 222 and the insulation layer 26 have a height difference, therefore, the deposition pattern of the first bonded metal unit 282 is realized through depositing at the corresponding positions of the insulation layer 26 and the positive electrode via hole 222, to form a trapezoid-shape first bonded metal unit 282, such that the first bonded metal unit 282 is connected electrically to the positive electrode 22. Similarly, since the negative electrode via hole 242 and the insulation layer 26 have a height difference, and also from step S16 it can be known that, the deposition pattern of insulation layer 26 is of a step shape; therefore, the deposition pattern of the second bonded metal unit 284 is formed on the insulation layer 26 and the negative electrode via hole 242 at their corresponding positions, to form a trapezoid-shape second bonded metal unit 284, such that the second bonded metal unit 284 is connected electrically to the negative electrode 24, as shown in FIG. 4F.

It is worth to note that, through this way of manufacturing the bonded metal layer 28, that positive electrode 22 and the negative electrode 24 are made to be on the same plane. Then, follow the process flow from step S10 to S20, to complete the structure of the light-emitting-diode (LED) 16.

Figure 4G:
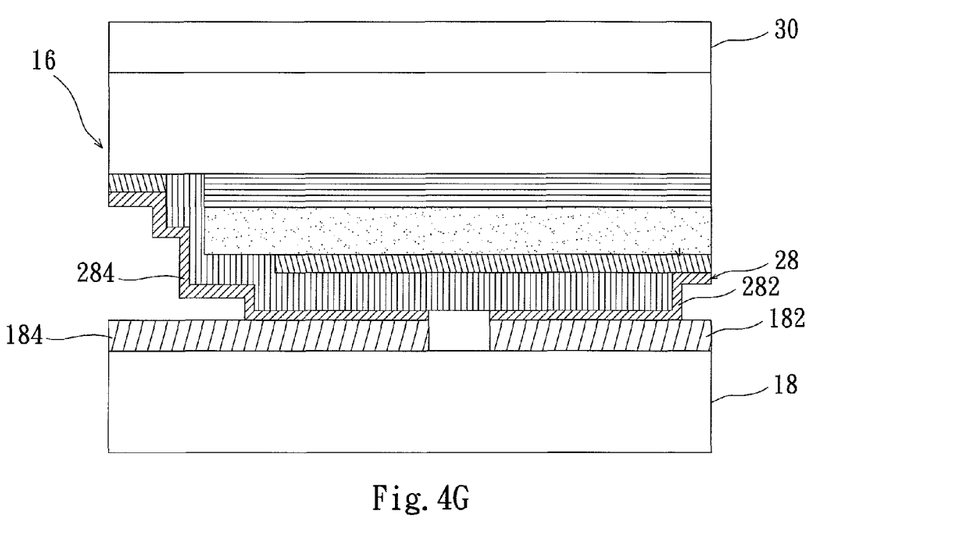

Furthermore, as shown in step S22, provide a substrate 18, and to produce a first metal layer 182 and a second metal layer 184 having electrode patterns, such as comb-shape or fork-shape electrode patterns on the substrate 18. Then, form the electrode patterns of the first metal layer 182 and the second metal layer 184 on the corresponding first bonded metal unit 282 and the second bonded metal unit 284 of the bonded metal layer 28. Subsequently, bond the first metal layer 182 and the second metal layer 184 onto the corresponding first bonded metal unit 282 and second bonded metal unit 284, to form into shape by means of eutectic gluing, as shown in FIG. 4G. It is worth to note that, through this special approach to produce LED 16, almost the entire area of the LED 16 is in contact with the substrate 18, to increase effectively its heat dissipation area, hereby raising the performance and service life of the light-emitting structure.

Figure 4H:
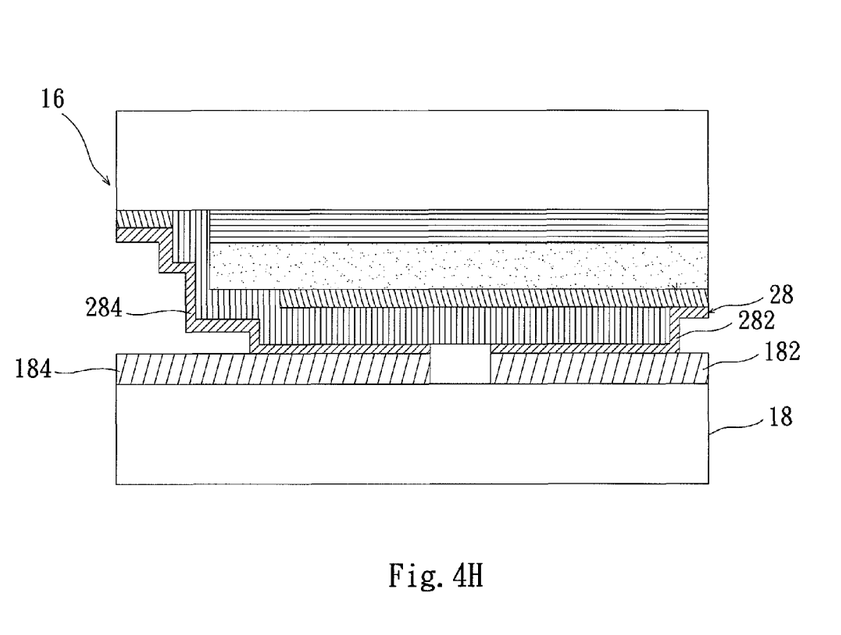

Finally, as shown in step S24, upon bonding into shape the LED 16 and the substrate 18, remove the carrier board 30, thus completing the bond type flip-chip light-emitting structure of the present invention as shown in FIG. 4H.

Summing up the above, in the present invention, the bonded metal layer is used to replace the bonded tin ball, to effectively reduce production cost, and increase heat dissipation area. Moreover, electrode patterns can be designed as required, to reduce area of negative electrode, and increase light-emitting area and improve current consistency, hereby raising effectively its overall light-emitting efficiency.

Furthermore, in the present invention, not only the ITO producing and tin ball bonding processes can be saved to simply manufacturing process, but the eutectic packaging process can also be performed to reduce production cost. As such, to the light-emitting structure, in the present tendency of increasing demand for high power illumination at reduced price, the present invention does indeed bring a tremendous and promising business opportunity to this Industry, thus having a good competitive edge in the market.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A bond type flip-chip light-emitting structure, comprising:
   a light-emitting-diode (LED), including:
      an epitaxy layer, containing sequentially an n-type semiconductor layer, a multi-quantum-well light-emitting layer, and a p-type semiconductor layer;
      a positive electrode, disposed on said p-type semiconductor layer;
      a negative electrode, disposed on said n-type semiconductor layer, that are located on a side wall of said multi-quantum-well light-emitting layer;
      an insulation layer, disposed on parts of said positive electrode and said negative electrode, to expose respectively a positive electrode via hole and a negative electrode via hole;
      a bonded metal layer, composed of a first bonded metal unit and a second bonded metal unit insulated to each other, and are connected respectively to said positive electrode and said second electrode; and
   a substrate, provided with a first metal layer and a second metal layer having electrode patterns, that are connected to said corresponding electrode patterns on said first bonded metal unit and said second bonded metal unit, to connect said LED to said substrate.

2. The bond type flip-chip light-emitting structure as claimed in claim 1, wherein said electrode pattern is a comb-shape electrode pattern or a fork-shape electrode pattern.

3. The bond type flip-chip light-emitting structure as claimed in claim 1, wherein said first metal layer and said second metal layer, are connected to said corresponding first bonded metal unit and said second bonded metal unit through eutectic gluing.

4. The bond type flip-chip light-emitting structure as claimed in claim 1, wherein said insulation layer is deposited onto said positive electrode and said negative electrode at their corresponding positions, to form a trapezoid-shape insulation layer.

5. The bond type flip-chip light-emitting structure as claimed in claim 1, wherein said first bonded metal unit is formed in a trapezoid-shape on parts of said insulation layer and said positive electrode via hole, and said second bonded metal unit is formed in a trapezoid-shape on parts of said insulation layer and said negative electrode via hole.

6. The bond type flip-chip light-emitting structure as claimed in claim 1, wherein said positive electrode and said negative electrode are made of Mo/Ag/Au, Ti/Al/Ti/Au, Pt/Ag/Au, Cr/Pt/Au, or Ni/Al/Ti/Au.

7. The bond type flip-chip light-emitting structure as claimed in claim 1, wherein said insulation layer is made of silicon dioxide, silicon nitride, aluminum oxide, or aluminum nitride.

8. The bond type flip-chip light-emitting structure as claimed in claim 1, wherein said insulation layer is made of zinc oxide, and is formed by sputtering zinc oxide on parts of said positive electrode and said negative electrode under 400° C., to serve as anti-electrostatic insulation layer.

9. The bond type flip-chip light-emitting structure as claimed in claim 1, wherein said bonded metal layer is made of Ti/Au, Sn/Au, Cu/Sn, Ti/Cu/Sn, or Ti/Au/Sn.

* * * * *

UNITED STATES PATENT AND TRADEMARK OFFICE
CERTIFICATE OF CORRECTION

PATENT NO. : 8,686,395 B2
APPLICATION NO. : 13/775539
DATED : April 1, 2014
INVENTOR(S) : Liann-Be Chang Page 1 of 1

It is certified that error appears in the above-identified patent and that said Letters Patent is hereby corrected as shown below:

In the Claims

In Claim 1, Line 32 at Column 6, change "second electrode" to "negative electrode".

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*